(12) United States Patent
Park et al.

(10) Patent No.: US 9,196,851 B2
(45) Date of Patent: Nov. 24, 2015

(54) ORGANIC PHOTOELECTRIC DEVICE AND IMAGE SENSOR

(71) Applicant: Samsung Electronics Co., Ltd., Suwon-Si, Gyeonggi-Do (KR)

(72) Inventors: Kyung Bae Park, Hwaseong-si (KR); Kyu Sik Kim, Yongin-si (KR); Jung Woo Kim, Hwaseong-si (KR); Kwang Hee Lee, Yongin-si (KR); Dong-Seok Leem, Hwaseong-si (KR); Seon-Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 13/866,323

(22) Filed: Apr. 19, 2013

(65) Prior Publication Data

US 2014/0070183 A1    Mar. 13, 2014

(30) Foreign Application Priority Data

Sep. 13, 2012 (KR) .......... 10-2012-0101781

(51) Int. Cl.
*H01L 31/0232* (2014.01)
*H01L 51/44* (2006.01)
*H01L 27/30* (2006.01)
*H01L 51/52* (2006.01)

(52) U.S. Cl.
CPC ............ *H01L 51/442* (2013.01); *H01L 27/307* (2013.01); *H01L 51/5234* (2013.01); *Y02E 10/549* (2013.01)

(58) Field of Classification Search
CPC . Y02E 10/549; H01L 51/5206; H01L 51/442; H01L 51/5234
USPC ........... 257/432, 449, 450, 454, 456, E31.129
See application file for complete search history.

(56) References Cited

U.S. PATENT DOCUMENTS

| | | | |
|---|---|---|---|
| 7,071,615 B2 | 7/2006 | Lu et al. | |
| 7,488,986 B2 * | 2/2009 | Yamazaki et al. | 257/93 |
| 8,728,615 B2 * | 5/2014 | Nakayama et al. | 428/220 |
| 2006/0036114 A1 * | 2/2006 | Wang et al. | 568/1 |
| 2009/0056810 A1 | 3/2009 | Marks et al. | |
| 2010/0201664 A1 * | 8/2010 | Lee et al. | 345/207 |

FOREIGN PATENT DOCUMENTS

JP    4857427 B2    1/2012

\* cited by examiner

*Primary Examiner* — John C Ingham
(74) *Attorney, Agent, or Firm* — Harness, Dickey & Pierce, P.L.C.

(57) ABSTRACT

An organic photoelectric device includes a first electrode, a metal nanolayer contacting one side of the first electrode, an active layer on one side of the metal nanolayer, and a second electrode on one side of the active layer. An image sensor includes the organic photoelectric device.

19 Claims, 7 Drawing Sheets

ORGANIC PHOTOELECTRIC DEVICE AND IMAGE SENSOR

CROSS-REFERENCE TO RELATED APPLICATION

This application claims priority to and the benefit of Korean Patent Application No. 10-2012-0101781 filed in the Korean Intellectual Property Office on Sep. 13, 2012, the entire contents of which are incorporated herein by reference.

BACKGROUND

1. Field

Example embodiments provide an organic photoelectric device and an image sensor.

2. Description of the Related Art

A photoelectric device refers to a device for converting light into an electrical signal using photoelectric effects. The photoelectric device may include a photodiode, a phototransistor, and the like, and may be applied to an image sensor, a solar cell, and the like.

An image sensor including a photodiode requires higher resolution and accordingly a smaller pixel. At present, a silicon photodiode is widely used, but has a problem of deteriorated sensitivity since it has a smaller absorption area due to smaller pixels. Accordingly, an organic photoelectric material that is capable of replacing silicon has been researched.

The organic material has a high extinction coefficient and selectively absorbs light in a particular wavelength region depending on a molecular structure, and thus may simultaneously replace a photodiode and a color filter and resultantly improve sensitivity and contribute to higher integration.

In order to implement a photodiode including an organic material, photoelectric conversion efficiency is required to be increased, and for this purpose, charge mobility between an electrode and an active layer is required to be increased.

SUMMARY

Some example embodiments provide organic photoelectric device that may improve photoelectric conversion efficiency due to improved charge mobility. Some example embodiments also provide an image sensor including the organic photoelectric device.

According to one example embodiment, an organic photoelectric device includes a first electrode, a metal nanolayer contacting one side of the first electrode, an active layer on one side of the metal nanolayer, and a second electrode on one side of the active layer.

The metal nanolayer may have a thickness of about 0.8 nm to about 10 nm. The metal nanolayer may have a thickness of about 0.8 nm to about 2 nm. The metal nanolayer may include at least one of aluminum (Al), magnesium (Mg), silver (Ag), nickel (Ni), cobalt (Co), lead (Pd), copper (Cu), gold (Au), and an alloy thereof. The first electrode may include at least one of indium tin oxide (ITO), indium zinc oxide (IZO), zinc oxide (ZnO), tin oxide (SnO), aluminum tin oxide (AITO), and fluorine doped tin oxide (FTO).

A combined work function of the metal nanolayer and the first electrode may be less than or equal to about 3.8 eV. The combined work function of the metal nanolayer and the first electrode may be about 3.3 eV to about 3.8 eV.

The organic photoelectric device may further include a first auxiliary layer between the second electrode and the active layer. The organic photoelectric device may further include a second auxiliary layer between the metal nanolayer and the active layer. The first electrode and second electrode may be light-transmission electrodes. The first electrode may be a cathode and the second electrode may be an anode.

According to another example embodiment, an image sensor includes the organic photoelectric device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present disclosure will be described more fully hereinafter with reference to the accompanying drawings, in which exemplary embodiments of this disclosure are shown. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Parts having no relationship with the description are omitted for clarity, and the same or similar constituent elements are indicated by the same reference numeral throughout the specification.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Figure 1:
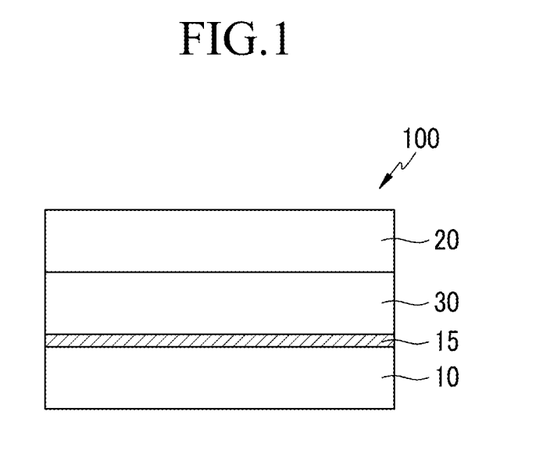
FIG. 1 is a cross-sectional view showing an organic photoelectric device according to an example embodiment.

An organic photoelectric device according to an example embodiment is described. FIG. 1 is a cross-sectional view showing an organic photoelectric device according to an example embodiment.

Referring to FIG. 1, an organic photoelectric device 100 according to an example embodiment includes a first electrode 10, a metal nanolayer 15 disposed on one side of the first electrode 10, an active layer 30 disposed on one side of the metal nanolayer 15, and a second electrode 20 disposed on one side of the active layer 30.

One of the first electrode 10 and second electrode 20 may be an anode and the other may be a cathode. For example, the first electrode 10 may be a cathode and the second electrode 20 may be an anode.

The active layer 30 includes a mixed p-type semiconductor material and n-type semiconductor material to form a pn junction, and externally receives light, generates excitons, and separates the excitons into holes and electrons. The active layer 30 may include an intrinsic layer including both p-type semiconductors and n-type semiconductors, and may be formed, for example, using a codeposition method and the like. The active layer 30 may further include at least one selected from a p-type layer and an n-type layer. The p-type layer includes a p-type semiconductor and the n-type layer includes an n-type semiconductor.

The p-type semiconductor may include, for example, N,N'-dimethyl-quinacridone (NNQA), diindenoperylene, dibenzo{[f,f']-4,4',7,7'-tetraphenyl}diindeno[1,2,3-cd:1',2',3'-lm]perylene, and the like, but is not limited thereto. The n-type semiconductor may include, for example dicyanovinyl-terthiophene (DCV3T), fullerene, a fullerene derivative, perylene diimide, and the like, but is not limited thereto.

The first electrode 10 may be made of, for example, a conductive oxide, for example at least one selected from indium tin oxide (ITO), indium zinc oxide (IZO), zinc oxide (ZnO), tin oxide (SnO), aluminum tin oxide (AITO), and fluorine doped tin oxide (FTO).

The metal nanolayer 15 contacts the first electrode 10 and lowers the energy barrier between the first electrode 10 and the active layer 30 to increase the charge mobility between the first electrode 10 and the active layer 30.

The metal nanolayer 15 may include, for example, at least one selected from aluminum (Al), magnesium (Mg), silver (Ag), nickel (Ni), cobalt (Co), lead (Pd), copper (Cu), gold (Au), and alloys thereof.

The metal nanolayer 15 may be an ultrathin film in a nano-level, instead of a bulk metal layer, to be applied for a surface layer modifying the work function of the first electrode 10 on the surface of the first electrode 10. The metal nanolayer 15 may have a thickness of about 0.8 nm to about 10 nm, for example, about 0.8 nm to about 2 nm.

Since the metal nanolayer 15 is formed relatively thin on the surface of the first electrode 10, the work function at the surface of the first electrode 10 may be represented by the combined work function of the metal nanolayer 15 and the first electrode 10. The combined work function refers to a work function of the surface of the first electrode formed with the metal nanolayer 15 on one surface, and may be measured by ultraviolet (UV) photoelectron spectroscopy (UPS).

The combined work function of the metal nanolayer 15 and the first electrode 10 may be less than or equal to about 3.8 eV, for example, about 3.3 eV to about 3.8 eV. Having the combined work function within the range, the energy barrier between the first electrode 10 and the active layer 30 is decreased to improve the charge mobility. Accordingly, the photoelectric conversion efficiency (external quantum efficiency, EQE) of the organic photoelectric device 100 may be improved.

In the organic photoelectric device 100, when light is incident from the first electrode 10 and/or the second electrode 20, and when the active layer 30 absorbs light having a given (or, alternatively predetermined) wavelength region, excitons may be generated from the inside. The excitons are separated into holes and electrons in the active layer 30, and the separated holes are transferred to an anode and the separated electrons are transferred to a cathode so as to flow a current in the organic photoelectric device.

Figure 2:
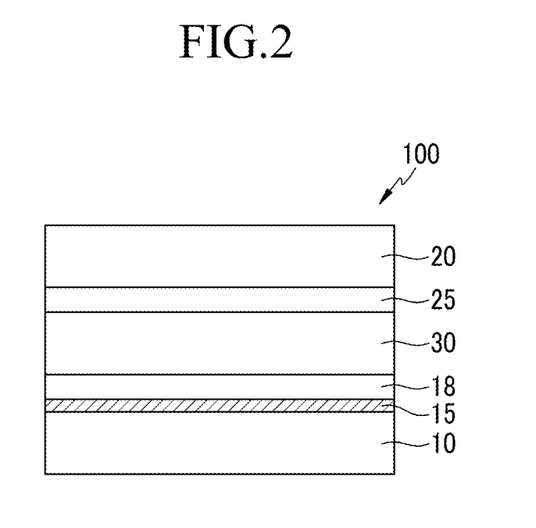
FIG. 2 is a cross-sectional view showing an organic photoelectric device according to another example embodiment.

Referring to FIG. 2, an organic photoelectric device according to another example embodiment is described. FIG. 2 is a cross-sectional view showing an organic photoelectric device according to another example embodiment.

Referring to FIG. 2, an organic photoelectric device 100 according to another embodiment includes a first electrode 10, a metal nanolayer 15 disposed on one side of the first electrode 10, an active layer 30 disposed on one side of the metal nanolayer 15, and a second electrode 20 disposed on one side of the active layer 30, and these are all the same as described in the above example embodiment.

However, the organic photoelectric device 100 according to this embodiment further includes charge auxiliary layers 18 and 25 respectively between the metal nanolayer 15 and the active layer 30 and between the second electrode 20 and the active layer 30. The charge auxiliary layers 18 and 25 may further facilitate the transportation of holes and electrons separated in the active layer 30, so as to increase efficiency.

The charge auxiliary layers 18 and 25 may be at least one selected from a hole injection layer (HIL) for facilitating hole injection, a hole transport layer (HTL) for facilitating hole transport, an electron blocking layer (EBL) for preventing or reducing electron transport, an electron injection layer (EIL) for facilitating electron injection, an electron transport layer (ETL) for facilitating electron transport, and a hole blocking layer (HBL) for preventing or reducing hole transport.

For example, when the first electrode 10 is a cathode and the second electrode 20 is an anode, the charge auxiliary layer 18 may be an electron injection layer (EIL), an electron transport layer (ETL), and/or a hole blocking layer (HBL), and the charge auxiliary layer 25 may be a hole injection layer (HIL), a hole transport layer (HTL), and/or an electron blocking layer (EBL).

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), tungsten oxide (WOx, $0<x\leq3$), molybdenum oxide (MOx, $1<x<3$), vanadium oxide ($V_2O_5$), nickel oxide (NiOx, $1<x<4$), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole (polypyrrole), N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), dicyanovinyl terthiophene (DCV3T), bathocuproine (BCP), LiF, $Alq_3$, $Gaq_3$, $Inq_3$, $Znq_2$, $Zn(BTZ)_2$, $BeBq_2$, and a combination thereof, but is not limited thereto. One of the charge auxiliary layers 18 and 25 may be omitted.

The organic photoelectric device may be applied to various fields, for example, a solar cell, an image sensor, a photodetector, a photo-sensor, and an organic light emitting diode (OLED), but is not limited thereto.

Hereinafter, an example of an image sensor including the organic photoelectric device is described referring to drawings. As an example of an image sensor, an organic CMOS image sensor is described.

Figure 3:
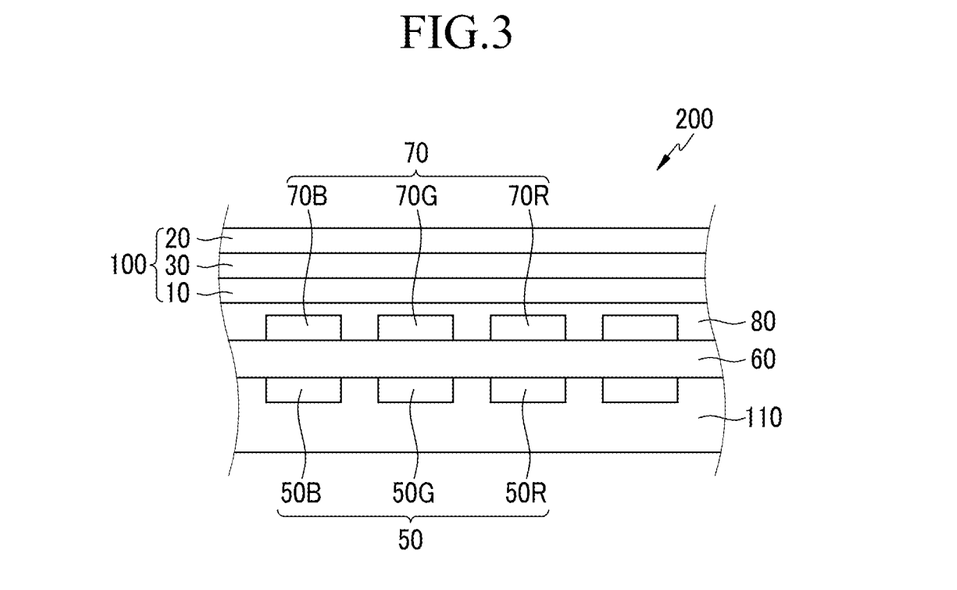
FIG. 3 is a cross-sectional view showing an organic CMOS image sensor according to an example embodiment.

FIG. 3 is a cross-sectional view showing an organic CMOS image sensor according to an example embodiment. FIG. 3 illustrates adjacent blue, green, and red pixels, but is not limited thereto. Hereinafter, a constituent element including B' in the reference symbol refers to a constituent element included in the blue pixel, a constituent element including 'G' refers to a constituent element included in the green pixel, and a constituent element including 'R' in the reference symbol refers to a constituent element included in the red pixel.

Referring to FIG. 3, an organic CMOS image sensor 200 includes a semiconductor substrate 110 integrated with a photo-sensing device 50 and a transmission transistor (not shown), a lower insulation layer 60, color filters 70B, 70G, and 70R, an upper insulation layer 80, and an organic photoelectric device 100.

The semiconductor substrate 110 may be a silicon substrate, and is integrated with the photo-sensing device 50 and a transmission transistor (not shown). The photo-sensing device 50 may be a photodiode. The photo-sensing device 50 and the transmission transistor may be integrated in each pixel, and as shown in the drawing, the photo-sensing device 50 includes a blue pixel photo-sensing device 50B, a green pixel photo-sensing device 50G, and a red pixel photo-sensing device 50R. The photo-sensing device 50 senses light, and the information sensed by the photo-sensing device 50 is transferred by a transmission transistor.

Metal wires (not shown) and pads (not shown) are formed on the semiconductor substrate 110. In order to decrease signal delay, the metal wires and pads may be made of a metal having relatively low resistivity, for example, aluminum (Al), copper (Cu), silver (Ag), and alloys thereof, but is not limited thereto.

A lower insulation layer 60 is formed on the metal wires and pads. The lower insulation layer 60 may be made of an inorganic insulating material such as silicon oxide and/or silicon nitride, or a low dielectric constant (low K) material such as SiC, SiCOH, SiCO, and SiOF.

The lower insulation layer 60 has a trench (not shown) exposing each photo-sensing device 50B, 50G, and 50R of each pixel. The trench may be filled with fillers.

A color filter 70 is formed on the lower insulation layer 60. The color filter 70 includes a blue filter 70B formed in the blue pixel, a green filter 70G formed in the green pixel, and a red filter 70R filled in the red pixel. The upper insulation layer 80 is formed on the color filter 70. The upper insulation layer 80 eliminates a step difference caused by the color filters 70 and smoothes the surface. The organic photoelectric device 100 is formed on the upper insulation layer 80. The organic photoelectric device 100 includes a first electrode 10, an active layer 30, and a second electrode 20 as above. For better understanding and ease of description, the organic photoelectric device 100 according to one example embodiment is shown, but is not limited thereto, and all organic photoelectric devices 100 according to all of the above embodiments may be applicable.

Both the first electrode 10 and the second electrode 20 may be the light-transmission electrode, and the active layer 30 may include an organic material absorbing light of the visible ray region.

The incident light from the second electrode 20 side is photoelectrically converted at the active layer 30, passed through the first electrode 10, and sensed by the photo-sensing device 50.

The organic CMOS image sensor according to this example embodiment increases the charge mobility between the electrode and the active layer by including the organic photoelectric device 100 to improve the photoelectric conversion efficiency (EQE).

Figure 4:
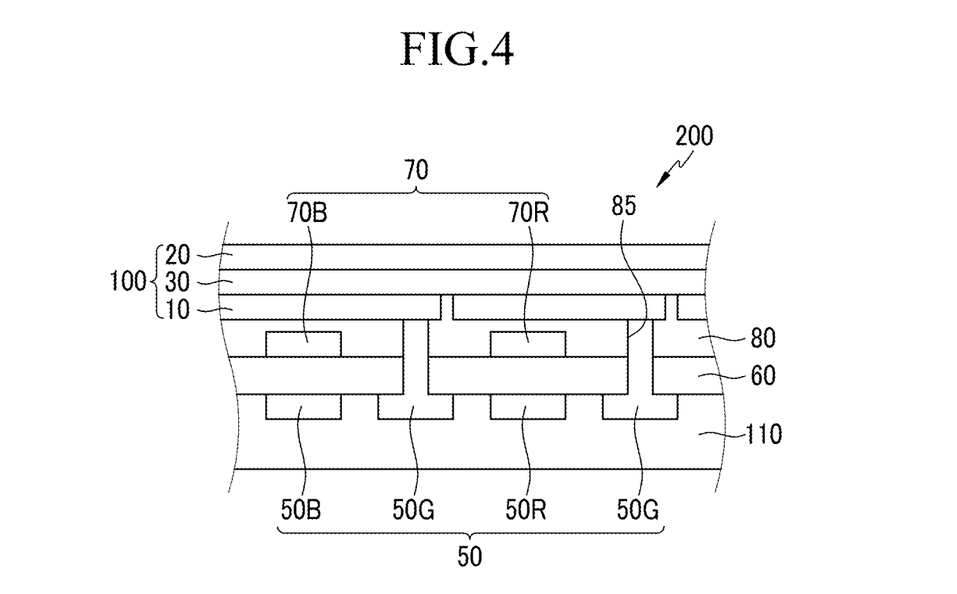
FIG. 4 is a cross-sectional view showing an organic CMOS image sensor according to another example embodiment.

FIG. 4 is a cross-sectional view showing an organic CMOS image sensor according to another example embodiment. The organic CMOS image sensor 200 according to this example embodiment includes a semiconductor substrate 110 integrated with a photo-sensing device 50 and a transmission transistor (not shown), a lower insulation layer 60, a color filter 70, an upper insulation layer 80, and an organic photoelectric device 100, as above.

However, the organic CMOS image sensor 200 according to this example embodiment may omit the green filter 70G, different from the above example embodiment, and instead may substitute an active layer 30 of the organic photoelectric device 100 for the green filter 70G. The active layer 30 of the organic photoelectric device 100 may include, for example, an organic material mainly absorbing light in a green wavelength region, and the light incident from the second electrode 20 may be photoelectrically converted by mainly absorbing light in the green wavelength region in the active layer 30, while light in the other wavelength regions is passed through the first electrode 10 and sensed by a photo-sensing device 50. The upper insulation layer 80 and the lower insulation layer 60 have through-holes 85 exposing the photo-sensing device 50G of the green pixel.

Hereinafter, the present disclosure is illustrated in more detail with reference to examples. However, these embodiments are examples, and the present disclosure is not limited thereto.

MEASUREMENT OF COMBINED WORK FUNCTION

Example 1

100 nm-thick ITO and 1 nm-thick aluminum (Al) are sequentially stacked on a glass substrate by thermal evaporation to prepare a sample.

Example 2

A sample is prepared in accordance with the same procedure as in Example 1, except that magnesium (Mg) is used instead of aluminum (Al).

Comparative Example 1

100 nm-thick ITO is stacked on a glass substrate by thermal evaporation to prepare a sample.

Comparative Example 2

A sample is prepared in accordance with the same procedure as in Example 1, except that $Cs_2CO_3$ is used instead of aluminum (Al).

Evaluation 1

The samples according to Examples 1 and 2 and Comparative Example 1 and 2 are measured for work function using ultraviolet (UV) photoelectron spectroscopy (UPS).

The results are shown in Table 1.

TABLE 1

|  | Work function (eV) |
| --- | --- |
| Example 1 | 3.36 |
| Example 2 | 3.80 |
| Comparative Example 1 | 4.49 |
| Comparative Example 2 | 3.92 |

Referring to Table 1, it is confirmed that the samples according to Examples 1 and 2 decrease the work function compared to the sample according to Comparative Example 1, and further decrease the effect of decreasing the work function compared to that of Comparative Example 2.

FABRICATION OF ORGANIC LIGHT EMITTING DIODE

Example 3

ITO is stacked on a glass substrate by sputtering to prepare a 100 nm-thick cathode. Then, aluminum (Al) is thermally evaporated on the cathode to a 1 nm-thick aluminum (Al) layer. Dicyanovinyl-terthiophene (DCV3T) at 20 nm, dicyanovinyl-terthiophene (DCV3T):N,N'-dimethyl quinacridone (NNQA) (1:1) at 110 nm, and tungsten oxide (WOx, $0<x\leq3$) at 30 nm are sequentially evaporated onto the aluminum (Al) layer. Then, silver (Ag) at 13 nm and tungsten oxide (WOx, $0<x\leq3$) at 30 nm are sequentially evaporated thereon to provide an anode, and an organic photoelectric device is fabricated.

Example 4

An organic photoelectric device is fabricated in accordance with the same procedure as in Example 3, except that 1 nm-thick magnesium (Mg) layer is provided instead of 1 nm-thick aluminum (Al) layer.

Comparative Example 3

An organic photoelectric device is fabricated in accordance with the same procedure as in Example 3, except that no aluminum (Al) layer is provided.

Comparative Example 4

An organic photoelectric device is fabricated in accordance with the same procedure as in Example 3, except that 1 nm-thick $Cs_2CO_3$ layer is provided instead of 1 nm-thick aluminum (Al) layer.

Evaluation 2

While applying various voltages to the organic photoelectric devices according to Examples 3 and 4 and Comparative Examples 3 and 4, the external quantum efficiency (EQE) according to wavelength is evaluated.

The results are described referring to FIGS. 5 to 8.

Figure 5:
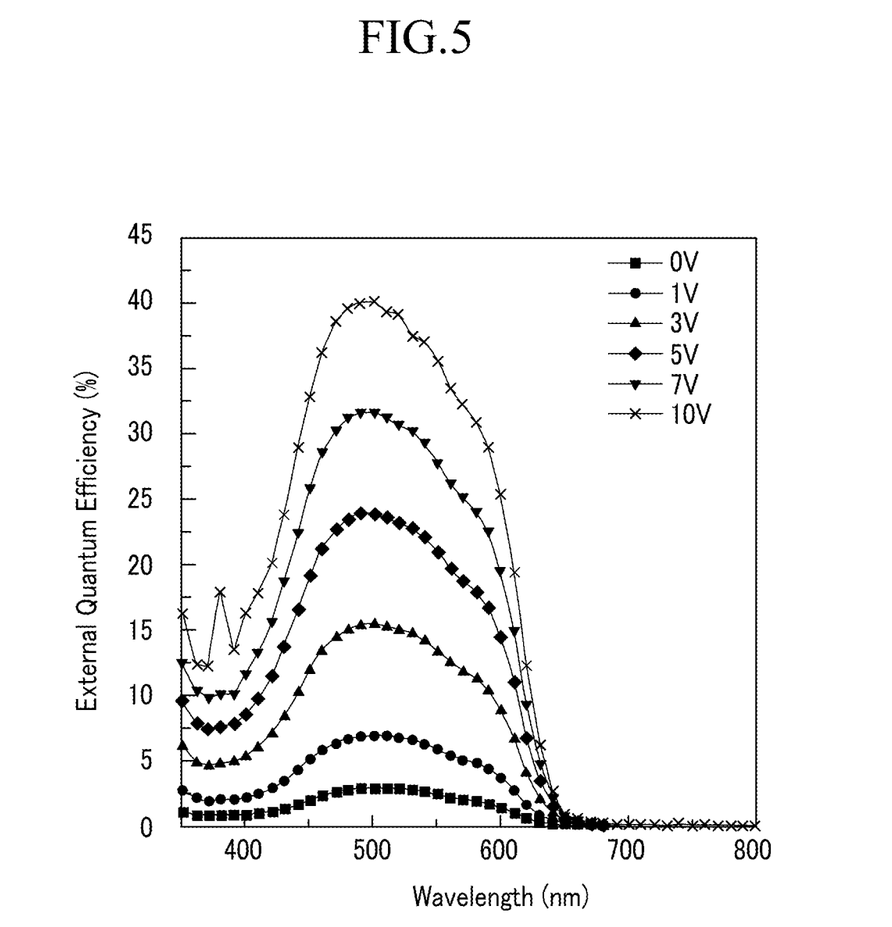
FIG. 5 is a graph showing external quantum efficiency (EQE) of an organic photoelectric device of Example 3 according to a wavelength.
Figure 6:
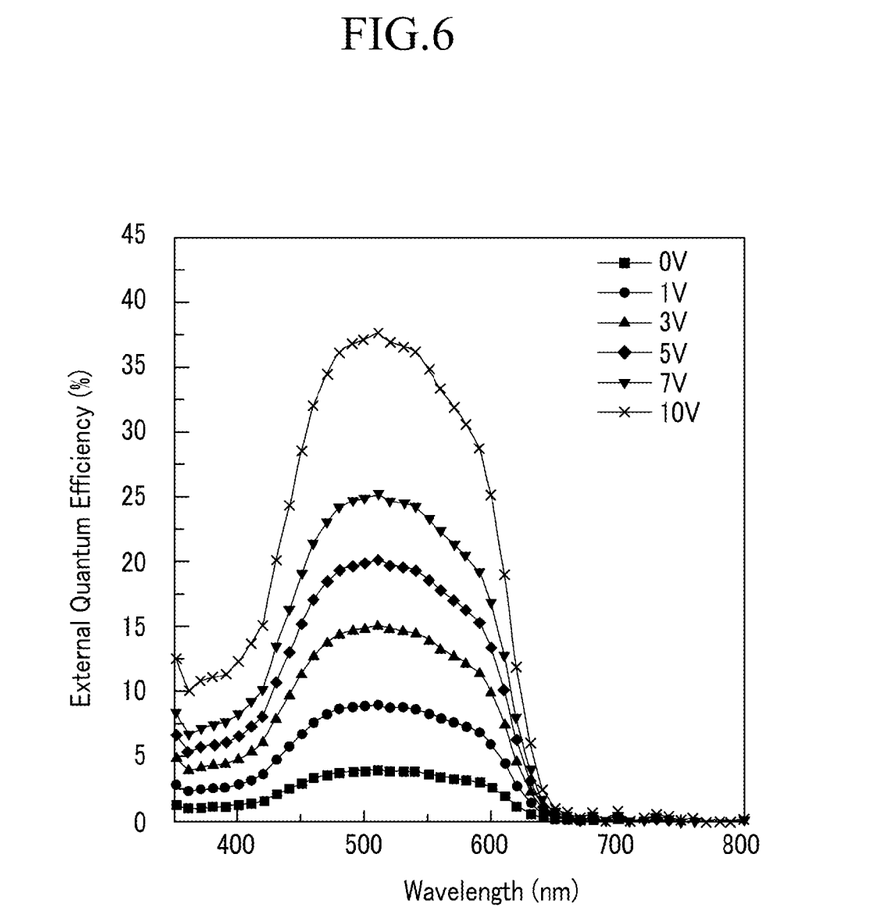
FIG. 6 is a graph showing external quantum efficiency (EQE) of an organic photoelectric device of Example 4 according to a wavelength.
Figure 7:
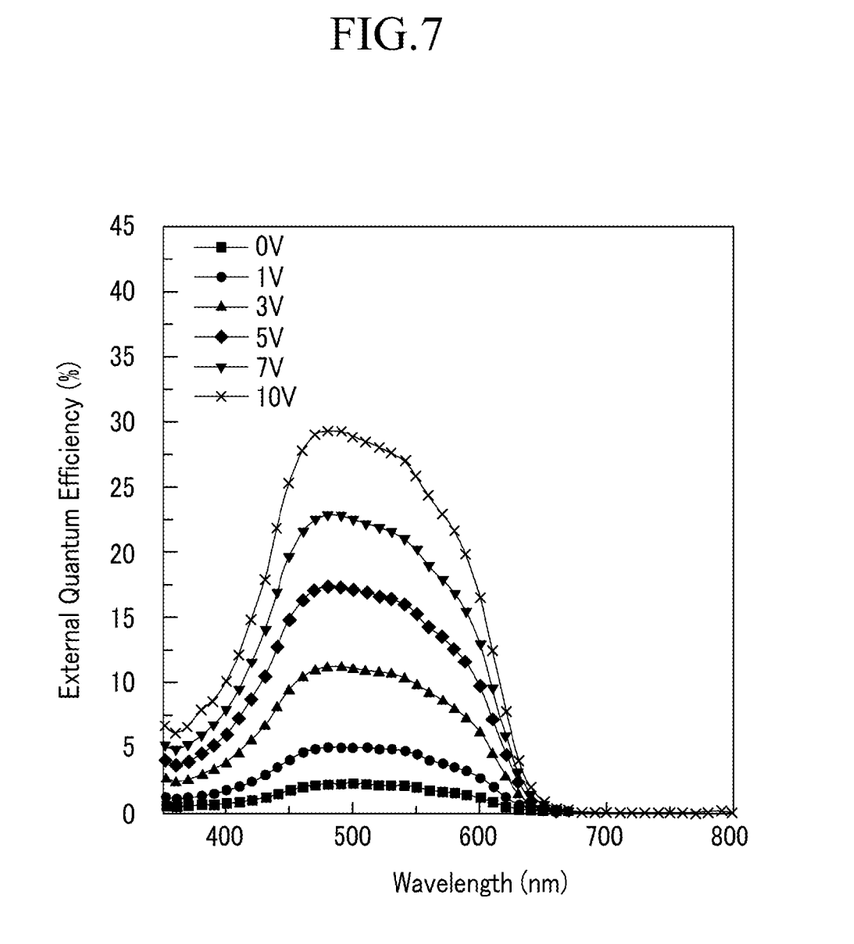
FIG. 7 is a graph showing external quantum efficiency (EQE) of an organic photoelectric device of Comparative Example 3 according to a wavelength.
Figure 8:
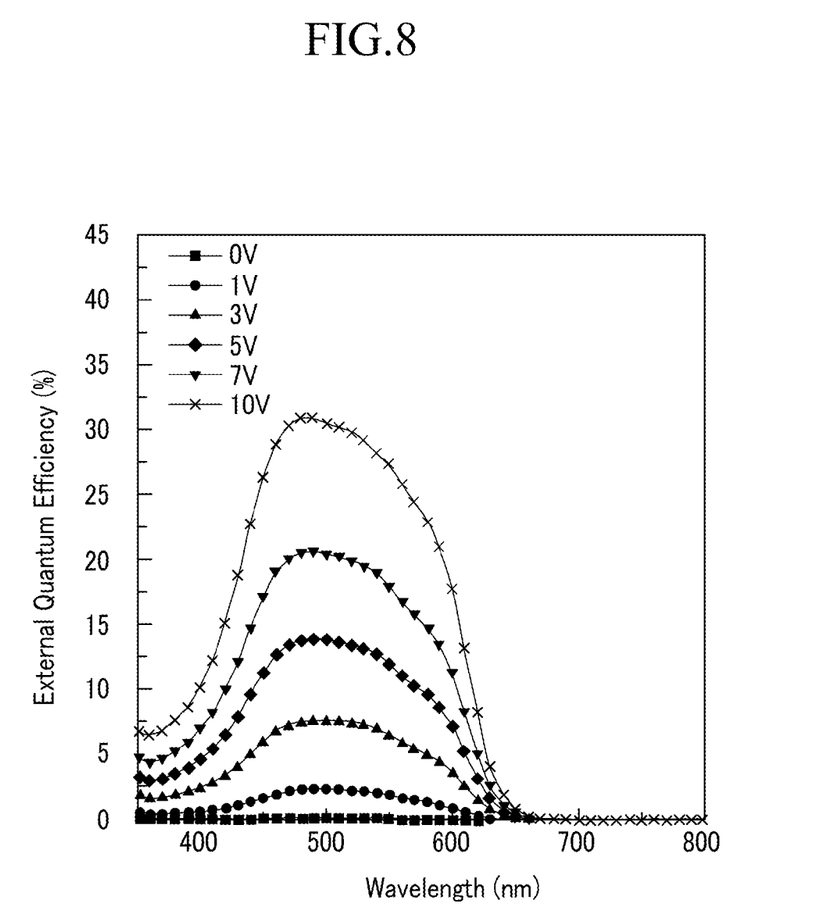
FIG. 8 is a graph showing external quantum efficiency (EQE) of an organic photoelectric device of Comparative Example 4 according to a wavelength.

FIG. 5 is a graph showing external quantum efficiency (EQE) of an organic photoelectric device of Example 3 according to wavelength, FIG. 6 is a graph showing external quantum efficiency (EQE) of an organic photoelectric device of Example 4 according to wavelength, FIG. 7 is a graph showing external quantum efficiency (EQE) of an organic photoelectric device of Comparative Example 3 according to wavelength, and FIG. 8 is a graph showing external quantum efficiency (EQE) of an organic photoelectric device of Comparative Example 4 according to wavelength.

Referring to FIG. 5 to FIG. 8, it is confirmed that the organic photoelectric device according to Examples 3 and 4 improve the external quantum efficiency (EQE) compared to the organic photoelectric devices according to Comparative Examples 3 and 4.

Figure 9:
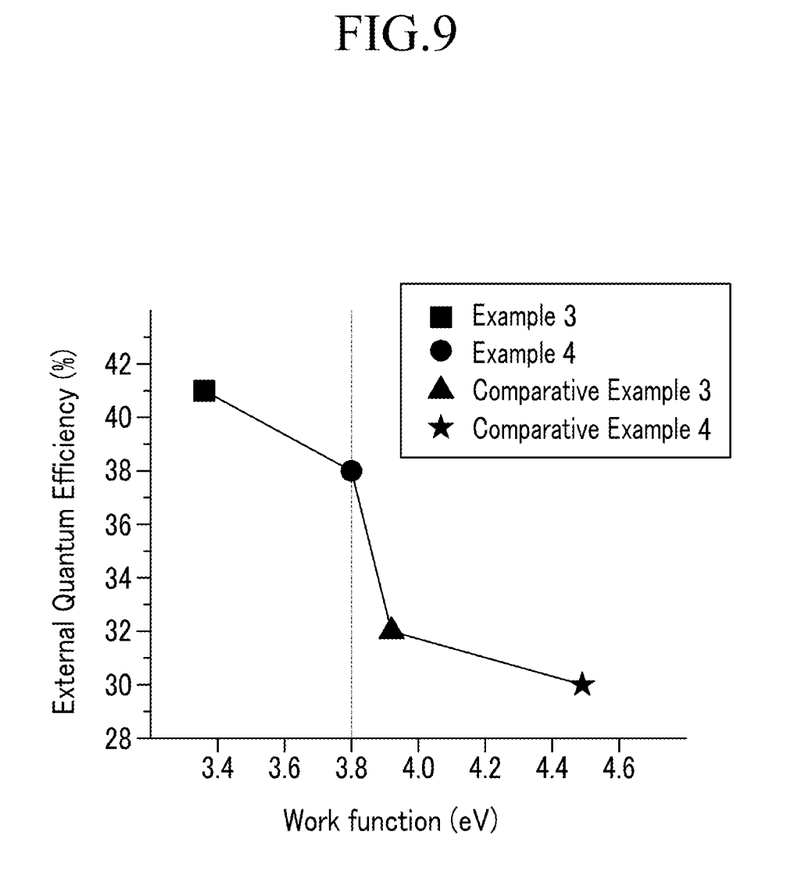
FIG. 9 is a graph showing a relationship of a work function of an electrode (cathode) and external quantum efficiency (EQE).

FIG. 9 is a graph showing a relationship of a work function of an electrode (cathode) and external quantum efficiency (EQE).

Referring to FIG. 9, it is confirmed that the external quantum efficiency (EQE) is improved by decreasing the work function of the electrode.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectric device, comprising:
   a first electrode;
   a metal nanolayer contacting one side of the first electrode;
   an active layer on one side of the metal nanolayer; and
   a second electrode on one side of the active layer,
   wherein a combined work function of the metal nanolayer and the first electrode is less than or equal to about 3.8 eV, and
   wherein a thickness T1 of the metal nanolayer is about 0.8 nm ≤T1<1 nm.

2. The organic photoelectric device of claim 1, wherein the metal nanolayer comprises at least one of aluminum (Al), magnesium (Mg), silver (Ag), nickel (Ni), cobalt (Co), lead (Pd), copper (Cu), gold (Au), and an alloy thereof.

3. The organic photoelectric device of claim 1, wherein the first electrode comprises at least one of indium tin oxide (ITO), indium zinc oxide (IZO), zinc oxide (ZnO), tin oxide (SnO), aluminum tin oxide (AlTO), and fluorine doped tin oxide (FTO).

4. The organic photoelectric device of claim 1, wherein the combined work function of the metal nanolayer and the first electrode is about 3.3 eV to about 3.8 eV.

5. The organic photoelectric device of claim 1, further comprising:
   a first auxiliary layer between the second electrode and the active layer.

6. The organic photoelectric device of claim 1, further comprising:
   a second auxiliary layer between the metal nanolayer and the active layer.

7. The organic photoelectric device of claim 1, wherein the first electrode and the second electrode are light-transmission electrodes.

8. The organic photoelectric device of claim 1, wherein the first electrode is a cathode and the second electrode is an anode.

9. The organic photoelectric device of claim 1, wherein the metal nanolayer comprises at least one of aluminum (Al), magnesium (Mg) and an alloy thereof.

10. The organic photoelectric device of claim 1, wherein the active layer includes a p-type semiconductor material and an n-type semiconductor material to form a pn junction.

11. An image sensor comprising an organic photoelectric device, the organic photoelectric device including,
    a first electrode;
    a metal nanolayer contacting one side of the first electrode;
    an active layer on one side of the metal nanolayer; and
    a second electrode on one side of the active layer,
    wherein a combined work function of the metal nanolayer and the first electrode is less than or equal to about 3.8 eV, and
    wherein a thickness Ti of the metal nanolayer is about 0.8 nm ≤T1<1 nm.

12. The image sensor of claim 11, wherein the metal nanolayer comprises at least one of aluminum (Al), magnesium (Mg), silver (Ag), nickel (Ni), cobalt (Co), lead (Pd), copper (Cu), gold (Au), and an alloy thereof.

13. The image sensor of claim 11, wherein the first electrode comprises at least one of indium tin oxide (ITO), indium zinc oxide (IZO), zinc oxide (ZnO), tin oxide (SnO), aluminum tin oxide (AlTO), and fluorine doped tin oxide (FTO).

14. The image sensor of claim 11, wherein the organic photoelectric device further comprises a first auxiliary layer between the second electrode and the active layer.

15. The image sensor of claim 11, wherein the organic photoelectric device further comprises a second auxiliary layer between the metal nanolayer and the active layer.

16. The image sensor of claim 11, wherein the first electrode and the second electrode are light-transmission electrodes.

17. The image sensor of claim 11, wherein the first electrode is a cathode and the second electrode is an anode.

18. The image sensor of claim 11, wherein the metal nanolayer comprises at least one of aluminum (Al), magnesium (Mg) and an alloy thereof.

19. The image sensor of claim 11, wherein the active layer includes a p-type semiconductor material and an n-type semiconductor material to form a pn junction.

* * * * *